United States Patent [19]

Gauthier

[11] Patent Number: 4,624,715
[45] Date of Patent: Nov. 25, 1986

[54] PROCESS FOR PASSIVATION OF PHOTOCONDUCTIVE DETECTORS MADE OF HG CD TE

[75] Inventor: André Gauthier, Paris, France
[73] Assignee: SAT, Paris, France
[21] Appl. No.: 657,585
[22] Filed: Oct. 4, 1984
[30] Foreign Application Priority Data Oct. 13, 1983 [FR] France .................................. 83 16261

[51] Int. Cl.[4] .............................................. C23C 22/60
[52] U.S. Cl. .................................. 148/6.14 R; 427/75
[58] Field of Search ...................... 148/6.14 R; 357/30, 357/52, 61; 427/75

[56] References Cited

U.S. PATENT DOCUMENTS 3,977,018 8/1976 Catagnus ............................... 357/30

FOREIGN PATENT DOCUMENTS 0068692 1/1983 European Pat. Off. .

OTHER PUBLICATIONS

Extended Abstracts, vol. 83, No. 2, Fevrier 1983, Princeton (U.S.) H. H. Strehblow et al.: "Formation and Reduction of Anodic Oxides on HgTe and DdO.8Te", pp. 576–577.
Applied Physics Letters, vol. 42, No. 9, Mai 1983, New York (U.S.).
E. Bertagnolli: "Effect of Anodic Growth Temperature on Native Oxides of N—(Hg,Cd) Te", pp. 824–826.

Primary Examiner—Sam Silverberg
Attorney, Agent, or Firm—Stevens, Davis, Miller & Mosher

[57] ABSTRACT

The present invention relates to a process for passivation of photoconductive detectors constituted by Hg Cd Te, wherein a layer of native oxide is formed on the faces of an Hg Cd Te wafer and it is made to grow, by pure chemical oxidation in an aqueous solution of $K_3Fe(CN)_6$ and of KOH. An ordinary layer of ZnS is then formed on the oxide layer. The process makes it possible to produce high-performance infrared detectors, simply.

7 Claims, 5 Drawing Figures

PROCESS FOR PASSIVATION OF PHOTOCONDUCTIVE DETECTORS MADE OF HG CD TE

BACKGROUND OF THE INVENTION

The present invention relates to a process for passivation of photoconductive detectors, made in particular of Hg Cd Te, used for the detection of infra-red radiations in a spectral domain depending on the proportion of Cd with respect to the Hg Cd assembly.

For a proportion close to 30%, the detection band extends from 3 to 5 $\mu$m, and for a proportion close to 20%, the band extends from 8 to 12 $\mu$m.

In order to avoid pollution thereof, these detectors are subjected to a surface passivation.

A process of passivation by deposit on the surface of the conductors of a layer of a chemical compound, such as for example zinc sulfide or silicon oxide, is known. Unfortunately, with such a process, the detectors are not very reliable, their performances, essentially their sensitivity and detectivity, degrading in time, particularly at a high temperature, greater in the present case than 70° C.

Now, both the sensitivity and detectivity of a photoconductive detector depend on the effective lifetime of the carriers which, itself, is inversely proportional to the surface recombination velocity of the carriers provoked by the incident radiation.

As the length of diffusion of the holes is notably greater than the thickness of the detector between its two opposite faces, recombination of the carriers is provoked by these two faces.

As this surface recombination velocity, which must therefore be as low as possible, depends on the surface potential, the latter must therefore be maintained stable for the detector to be reliable.

U.S. Pat. No. 3,977,018 proposes a process for minimizing and stabilizing the surface recombination velocity of the two sides of a photoconductive detector, with a surface charge density greater than that in volume. This process consists, on a material, for example of n type, in forming on the surface a passivation layer with positive charge density, in order thus to create on the surface a layer of type n+. The dipoles contained in this layer are oriented with their positive charges disposed on the inside of the material, and repel the minority carriers of the material constituted by the holes. The recombination of the latter on the surface is therefore reduced, whilst their effective lifetime is increased.

More precisely, this Patent proposes to make a previously formed layer of native oxide grow on at least one of the faces of the detector, by electrochemical method and, more particularly, by anodic oxidation of the material in an electrolyte.

Although the process of this Patent makes it possible to produce passivated infrared photoconductive detectors with long and stable lifetime at high temperatures, it nonetheless presents several drawbacks.

Firstly it is relatively complex to carry out in view of its electrochemical nature. Secondly, a particular embodiment of the process must correspond to each type of detector material. Finally, certain performances of the detectors obtained by this process are not yet totally satisfactory, particularly their detectivity.

SUMMARY OF THE INVENTION

It is therefore an object of the present invention to overcome the drawbacks of the latter process and it relates to this end to a process for passivation of photoconductive detectors wherein a layer of native oxide is formed on at least one of the faces of a wafer of a photoconductive detector material and said layer is then made to grow, said process being characterized in that the native oxide layer is formed by pure chemical oxidation, preferably, in the case of an Hg Cd Te detector, by oxidation of Te by steeping the wafer in an aqueous solution of potassium ferricyanide [$K_3Fe(CN)_6$] and of a basic medium, advantageously potassium hydroxide KOH.

In a preferred embodiment of the process of the invention, a complementary passivation layer of known type, such as for example a dielectric layer of zinc sulfide, is formed on the layer of oxide.

The process for obtaining the first passivation layer is remarkably simple. In the particular case of the Hg Cd Te material, it is the $Fe(CN)_6^{3-}$ ions which oxidize the tellurium to form $TeO_2$.

BRIEF DESCRIPTION OF THE DRAWINGS

The invention will be more readily understood on reading the following description with reference to the accompanying drawings, in which.

DETAILED DESCRIPTION OF A PREFERRED EMBODIMENT OF THE INVENTION

Figure 1:
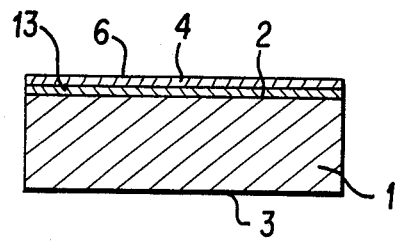
FIG. 1 shows a detector with its inner face passivated according to the process of the invention.
Figure 2:
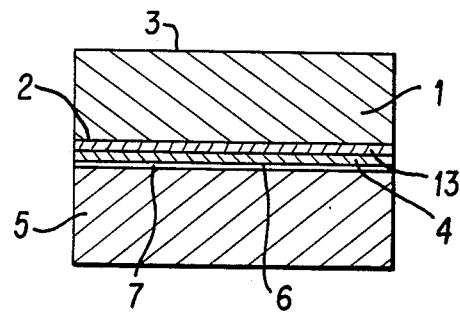
FIG. 2 shows the detector of FIG. 1, fixed on a substrate by its passivated inner face.
Figure 3:
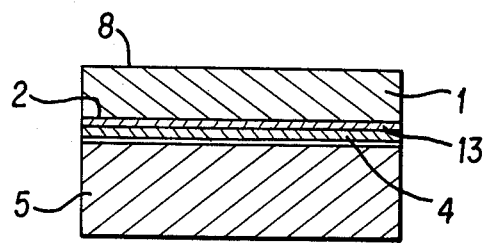
FIG. 3 shows the detector of FIG. 2, with the thinned detector wafer.
Figure 4:
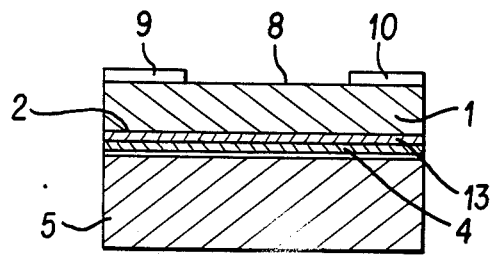
FIG. 4 shows the detector of FIG. 3, with electrical contacts on its outer face.
Figure 5:
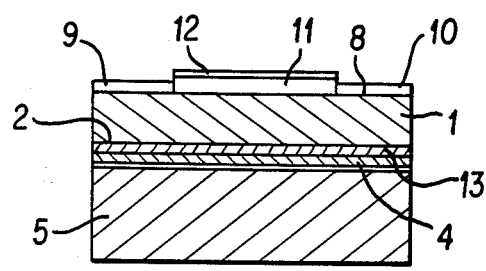
FIG. 5 shows the detector of FIG. 4, with its passivated outer face.

Referring now to the drawings, a wafer 1 made of Hg Cd Te is considered, from a passivated infrared photoconductive detector will be made. The conductivity of the substrate 1 is, in the case in question, of n type.

A first, inner, face 2 of the two opposite faces 2 and 3 of the wafer from which a layer of native oxide of tellurium ($TeO_2$) will be formed and then made to grow, is firstly prepared. To this end, the original face 2 is subjected to lapping then polushing. The wafer 1 is then steeped in a bromide-methanol solution to chemically attack this face 2 and thus eliminate any trace of oxide which might have formed previously and been detrimental to homogeneous growth of the layer of $TeO_2$; it is washed and dried.

Immediately after the face 2 has been prepared, the wafer 1 is again steeped in an aqueous solution of $K_3Fe(CN)_6$ and KOH, so that at least this face 2 bathes in the solution, in order firstly to form the layer of native $TeO_2$, of which analysis was made by the ESCA method, i.e. by electronic spectroscopy applied to chemical analysis, and then to make this layer of $TeO_2$ grow, as a function of the time during which the face 2 of the wafer is maintained in the bath of the solution.

The dissolution of the ferricyanide and of the potassium hydroxide was advantageously effected in pure water with a $K_3Fe(CN)_6$ concentration of between 0.075 and 0.75 mole per liter of water, and a KOH concentration of between 0.06 and 0.6 mole per liter of water. At this point it should be noted that any basic medium other than potassium hydroxide would also be suitable.

Of course, the speed of oxidation depends on the concentrations retained, like the thickness of the layer of oxide, on the time during which the $Fe(CN)_6^{3-}$ ions act on the tellurium. As the layer of oxide 13 increases, so the speed of growth obviously decreases.

For a temperature of the solution of oxidation maintained at 23° C., the results shown in the following table were obtained:

| Duration of oxidation minutes (mn) | 5 | 10 | 20 | 40 | 80 |
|---|---|---|---|---|---|
| Thickness of the layer of oxide Å | 400 | 800 | 1400 | 2300 | 3000 |
| Average speed of growth Å/mn | 80 | 70 | 70 | 57 | 37 |
| Relative speed of growth Å/mn | 80 | 80 | 60 | 45 | 17 |

The various values of the relative speed of growth clearly illustrate the phenomenon of reduction in the speed of growth with oxidation. Thus the layer 13 increased by 400 Å the first five minutes, but only by 700 Å the last forty minutes.

When the oxide layer 13 has reached the desired thickness, in the present case 1000 to 1500 Å, or after a period of about 15 to 30 mins., the wafer 1 is removed from the oxidation bath, is washed and dried, and a complementary passivation layer 4 of zinc sulfide, with a thickness of 3000 to 5000 Å, is deposited on the oxide layer 13 by in vacuo evaporation.

The first face 2 of the detector is then passivated.

The wafer 1, with its two passivation layers 13 and 4, is then taken and is fixed on a substrate 5, of quartz or sapphire, by the outer face 6 of the second passivation layer 4, by means of an adhesive 7, advantageously an epoxy adhesive.

The second, outer, face 3 of the wafer 1, opposite the inner face 2, is subjected to lapping then to polishing in order to thin the Hg Cd Te wafer 1 to a thickness of about 10 to 15 μm.

The wafer 1 is then stepped in a bromium-methanol solution, as before, in order chemically to attack the face 8 last lapped and polished, for the same purpose as set forth hereinabove; it is washed and dried.

Two electrical contacts 9, 10 are then deposited on this face 8 near the two lateral edges of the wafer, by in vacuo evaporation of a metallic layer, for example chromium-gold, under conditions well known to the man skilled in the art.

A first passivation oxide layer 11 is then formed, between contacts 9, 10, as before, in an aqueous solution of $K_3Fe(CN)_6$ and KOH, and, finally, a complementary passivation layer 12, like layer 4 previously described, is formed on this first passivation layer.

The process which has just been described is particularly simple to carry out and may be used to passivate any type of detector.

The passivated detector thus obtained is endowed with excellent characteristics which in addition remain stable at high temperature, of the order of 80° C. For a wave length $\lambda p = 4.5$ μm, and at a temperature of 195° K., or −78° C., its detectivity D* is thus greater than $10^{11} w^{-1}$ cm $H_z^{\frac{1}{2}}$.

Of course, if only one of the two opposite faces 2, 3 of the wafer 1 had to be passivated, it would be the outer face (3, 8). On the contrary, as it is advantageous for all the faces of the wafer to be passivated equally, there is no particular precaution to be taken when the wafer is steeped in the oxidation bath for the passivation of a determined face.

What is claimed is:

1. A process for passivation of photoconductive detectors comprising Hg Cd Te, which process comprises forming a layer of native oxide on at least one of the faces of a wafer of a photoconductive detector material which is then made to grow, said process being characterized in that the layer of native oxide is formed by pure chemical oxidation in an aqueous solution of $K_3Fe(CN)_6$ in a basic medium.

2. The process of claim 1, characterized in that a complementary passivation layer is formed on the layer of oxide.

3. The process of claim 1, characterized in that the wafer is steeped in an aqueous passivation solution to form the passivation oxide layer.

4. The process of claim 1, characterized in that the wafer 1 is maintained for a period of about 15 to 30 mins. in the solution at 23° C.

5. The process of claim 2, characterized in that the complementary layer is a layer of ZnS.

6. The process of claim 1, characterized in that a passivation oxide layer is formed on each of the two opposite faces of the wafer.

7. The process of claim 1, wherein the conductivity of the material of the wafer is of n type.

* * * * *